United States Patent
Nakakohara et al.

(10) Patent No.: US 12,424,820 B2
(45) Date of Patent: Sep. 23, 2025

(54) LASER DIODE DRIVING CIRCUIT

(71) Applicant: Rohm Co., Ltd., Kyoto (JP)

(72) Inventors: Yusuke Nakakohara, Kyoto (JP); Tan Nhat Hoang, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 771 days.

(21) Appl. No.: 17/767,245

(22) PCT Filed: Aug. 26, 2020

(86) PCT No.: PCT/JP2020/032145
§ 371 (c)(1),
(2) Date: Apr. 7, 2022

(87) PCT Pub. No.: WO2021/079611
PCT Pub. Date: Apr. 29, 2021

(65) Prior Publication Data
US 2022/0376470 A1   Nov. 24, 2022

(30) Foreign Application Priority Data
Oct. 23, 2019   (JP) .................................. 2019-192903

(51) Int. Cl.
*H01S 5/042*   (2006.01)
*G01S 7/484*   (2006.01)
*H01S 5/0233*   (2021.01)

(52) U.S. Cl.
CPC ............ *H01S 5/0428* (2013.01); *G01S 7/484* (2013.01); *H01S 5/0233* (2021.01)

(58) Field of Classification Search
CPC .. H01S 5/0428; H01S 5/0233; H01S 5/06216; H01S 5/042; G01S 7/484; G01S 7/4814; G01S 17/42; G01S 17/931
See application file for complete search history.

(56) References Cited

U.S. PATENT DOCUMENTS 7,812,933 B2   10/2010   Jensen et al.
9,054,485 B1*   6/2015   Ng .......................... H01S 5/0427
(Continued)

FOREIGN PATENT DOCUMENTS

| CN | 101490503 | 7/2009 |
| JP | H10502181 | 2/1998 |

(Continued)

OTHER PUBLICATIONS

JP OA—Japanese Patent Office, Office Action in Japanese Appln. No. 2021-554111, dated Sep. 3, 2024, 5 pages (with machine translation).

(Continued)

*Primary Examiner* — Xinning (Tom) Niu
(74) *Attorney, Agent, or Firm* — Fish & Richardson P.C.

(57) ABSTRACT

A laser diode driving circuit includes a switching element, a controller configured to turn on an off the switching element, a second series circuit connected in parallel with a first series circuit including a laser diode, and a capacitor. The second series circuit includes a rectifying element and a current limiter configured to limit a current passing through the rectifying element, and is connected in parallel with the first series circuit such that the direction pointing from the anode to the cathode of the rectifying element is opposite to the direction pointing from the anode to the cathode of the laser diode. The capacitor is configured to be charged when the switching element is off and to form a closed circuit with the switching element and the first and second series circuits when the switching element is on.

17 Claims, 12 Drawing Sheets

(56) References Cited

U.S. PATENT DOCUMENTS

| | | | |
|---|---|---|---|
| 11,329,451 B2 | 5/2022 | Pannwitz | |
| 2003/0039280 A1* | 2/2003 | Mangano | H01S 5/0428 372/38.02 |
| 2003/0090647 A1* | 5/2003 | Isogai | G01S 7/4816 356/4.01 |
| 2005/0287817 A1* | 12/2005 | Burgener, II | H10H 20/8232 438/758 |
| 2009/0279069 A1* | 11/2009 | Jensen | G01S 7/4814 356/5.1 |
| 2015/0372451 A1 | 12/2015 | Fulkerson et al. | |
| 2016/0191196 A1* | 6/2016 | Troiani | H04B 10/504 398/52 |
| 2018/0109074 A1 | 4/2018 | Gassend et al. | |
| 2018/0159529 A1 | 6/2018 | Reusch et al. | |
| 2018/0261975 A1 | 9/2018 | Pavlov et al. | |
| 2020/0321748 A1 | 10/2020 | Pannwitz | |

FOREIGN PATENT DOCUMENTS

| | | | |
|---|---|---|---|
| JP | 2002208677 | 7/2002 | |
| JP | 2002333476 | 11/2002 | |
| JP | 2009544022 | 12/2009 | |
| JP | 2015179436 | 10/2015 | |
| JP | 2016512652 | 4/2016 | |
| JP | 2016152336 | 8/2016 | |
| JP | 2018077073 | 5/2018 | |
| WO | WO-2014167068 A1 * | 10/2014 | H01S 5/0428 |
| WO | WO 2019086401 | 5/2019 | |

OTHER PUBLICATIONS

International Search Report in International Appln. No. PCT/JP2020/032145, dated Nov. 2, 2020, 6 pages.

CN OA—The State Intellectual Property Office of People's Republic of China, Office Action in Chinese Appln. No. 202080074065.4, dated Jan. 14, 2025, 12 pages (with English translation).

* cited by examiner

Y1

LASER DIODE DRIVING CIRCUIT

TECHNICAL FIELD

The present invention relates to a laser diode driving circuit.

BACKGROUND ART

Patent Document 1 discloses a laser diode driving circuit capable of outputting laser light with a short pulse. This laser diode driving circuit turns off a switching element to charge a capacitor and then turns on the switching element to make the laser diode emit light with the discharge current from the capacitor, and, after the laser diode stops emitting light, turns off the switching element to charge the capacitor again (see FIG. 2 of Patent Document 1).

LIST OF CITATIONS

Patent Literature

Patent Document 1: JP-A-2016-152336

SUMMARY OF THE INVENTION

Problem to be Solved by the Invention

According to Patent Document 1, when the electric charge accumulated in the capacitor runs out, the discharge current from the capacitor becomes zero and the laser diode stops emitting light. Here, the period after the switching element turns on until the discharge current from the capacitor becomes zero, that is, the pulse width of the laser light depends on the circuit constants of the LCR resonant circuit. The LCR resonant circuit includes a capacitor, a laser diode, a switching element in an on state, a diode connected in parallel with the laser diode such that the anode and cathode of the former reversed relative to those of the latter, and a parasitic inductance.

In the laser diode driving circuit disclosed in Patent Document 1, the on-period of the switching element is set to be equal to or longer than 1000 times the output period of the laser light (see paragraphs 0042 to 0043 and FIGS. 3 and 6 of Patent Document 1). This causes unnecessary laser light output intermittently until the resonance of the LCR resonant circuit sufficiently attenuates.

The present invention is aimed at providing a laser diode driving circuit that can suppress unnecessary laser light output, as well as a laser device, a laser radar device, and a vehicle including such a laser diode driving circuit.

Means for Solving the Problem

To achieve the above object, according to one aspect of the present invention, a laser diode driving circuit includes a switching element, a controller configured to turn on an off the switching element, a second series circuit connected in parallel with a first series circuit including a laser diode, and a capacitor. The second series circuit includes a rectifying element and a current limiter configured to limit a current passing through the rectifying element, and is connected in parallel with the first series circuit such that the direction pointing from the anode to the cathode of the rectifying element is opposite to the direction pointing from the anode to the cathode of the laser diode. The capacitor is configured to be charged when the switching element is off and to form a closed circuit with the switching element and the first and second series circuits when the switching element is on (a first configuration). As the capacitor, there may be provided only one capacitor or a plurality of capacitors connected in parallel.

The first series circuit may include the laser diode alone or may have a plurality of components including the laser diode connected in series. At least one of the plurality of components may be a parallel circuit.

The laser diode driving circuit according to the first configuration described above, preferably, further includes a shunt resistor configured to detect a current passing through the laser diode. The shunt resistor may be included in the first series circuit, and the impedance of the shunt resistor may be configured to be lower than the impedance of the current limiter (a second configuration).

The laser diode driving circuit according to the first configuration described above, preferably, further includes a shunt resistor configured to detect a current passing through the laser diode. The shunt resistor may be provided outside the first series circuit, and the impedance of the shunt resistor may be configured to be lower than the impedance of the current limiter (a third configuration).

In the laser diode driving circuit according to the second or third configuration described above, preferably, the shunt resistor has a plurality of resistive elements connected in parallel (a fourth configuration).

In the laser diode driving circuit according to the fourth configuration described above, preferably, the interval between adjacent resistive elements is equal to or larger than the value resulting from dividing double the length of the resistive element by Napier's constant (a fifth configuration).

In the laser diode driving circuit according to any of the first to fifth configurations described above, preferably, when the switching element is off, the forward voltage across a body diode of the switching element is higher than 0.7 V (a sixth configuration).

In the laser diode driving circuit according to the sixth configuration described above, preferably, the switching element is a MOS field-effect transistor, and, when the switching element is off, the gate-source voltage of the switching element is negative (a seventh configuration).

In the laser diode driving circuit according to any of the first to seventh configurations described above, preferably, the switching element uses a wide-band-gap semiconductor with a band gap greater than a silicon semiconductor (an eighth configuration).

To achieve the above object, according to another aspect of the present invention, a laser device includes the laser diode driving circuit according to any of the first to eighth configurations described above and the laser diode (a ninth configuration).

The laser device according to the ninth configuration described above, preferably, further includes a circuit board. The laser diode may be mounted on a first face of the circuit board, and the switching element and the capacitor may be mounted on a second face of the circuit board that faces away from the first face (a tenth configuration).

The laser device according to the tenth configuration described above, preferably, at least part of at least one of the switching element and the capacitor overlaps the laser diode as seen from the direction normal to the first and second faces (an eleventh configuration).

To achieve the above object, according to yet another aspect of the present invention, a laser radar device includes the laser device according to any of the ninth to eleventh configurations (a twelfth configuration).

To achieve the above object, according to still another aspect of the present invention, a vehicle includes the laser radar device according to the twelfth configuration described above (a thirteenth configuration).

Advantageous Effects of the Invention

According to the present invention, it is possible to suppress unnecessary laser light output.

DESCRIPTION OF EMBODIMENTS

1. First Embodiment

Figure 1:
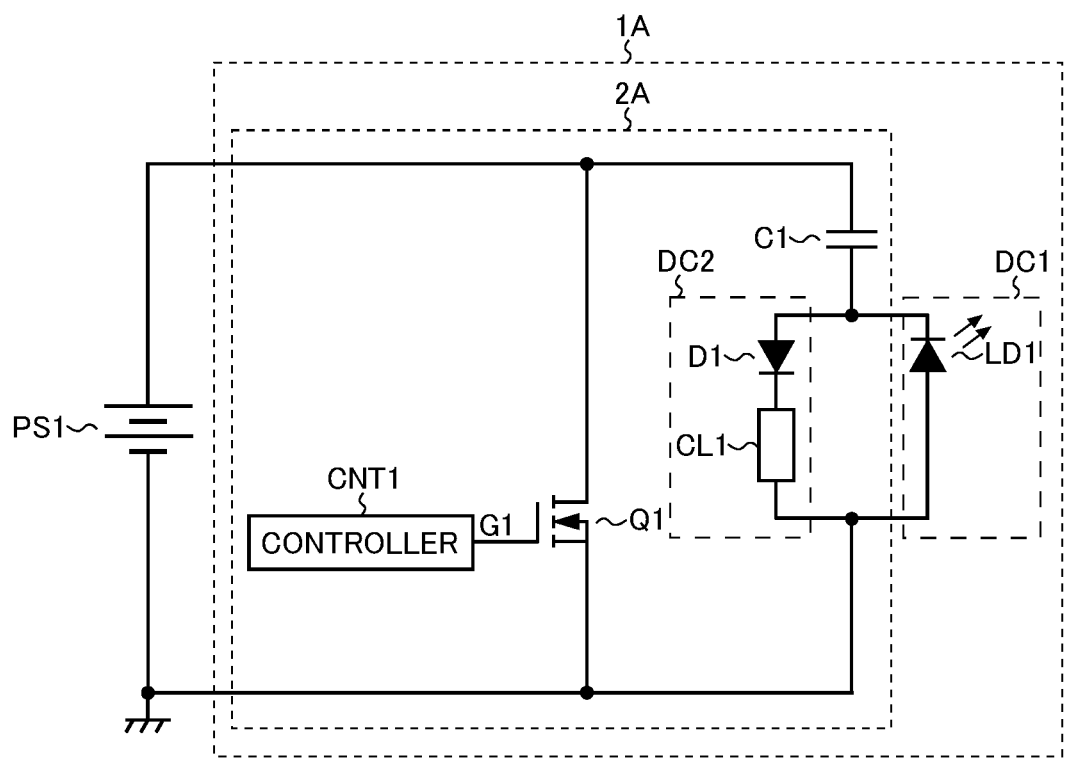
FIG. 1 is a diagram showing an outline of the configuration of a laser device according to a first embodiment.

FIG. 1 is a diagram showing an outline of the configuration of a laser device according to a first embodiment. The laser device 1A according to the first embodiment (hereinafter referred to as the laser device 1A) includes a laser diode LD1 and a laser diode driving circuit 2A.

The laser diode driving circuit 2A includes an NMOS (N-channel metal-oxide-semiconductor) transistor Q1, a controller CNT1, a capacitor C1, a diode D1, and a current limiter CL1. In the present description, a MOS transistor denotes a field-effect transistor of which the gate is structured to have at least three layers: a layer of an electrical conductor or of a semiconductor such as polysilicon with a low resistance value, an insulation layer, and a P-type, N-type or intrinsic semiconductor layer. That is, the structure of the gate of the MOS transistor is not limited to a three-layer structure composed of a metal, an oxide, and a semiconductor.

Although, in this embodiment, the NMOS transistor Q1 is used as a switching element, any switching element other than an NMOS transistor Q1 may be used instead of the NMOS transistor Q1. Although, in this embodiment, the diode D1 is used as a rectifying element, any rectifying element other than a diode D1 may be used instead of the diode D1.

The current limiter CL1 is, for example, a single resistive element. The current limiter CL1 may be a resistance circuit composed of, for example, a plurality of resistive elements instead of a single resistive element. The current limiter CL1 may be, for example, a single diode instead of a single resistive element. The current limiter CL1 may be, for example, a plurality of series-connected diodes instead of a single resistive element. The current limiter CL1 may be, instead of a single resistive element, for example, a MOS field-effect transistor that limits current as its gate-source voltage is adjusted, a bipolar transistor that limits current as its base-emitter voltage is adjusted, or the like. The current limiter CL1 is not limited to an element. Instead, it may be, for example, a conductor on a circuit board. When part of a conductor is used as the current limiter CL1, the part of the conductor corresponding to the current limiter CL1 may be formed in a shape and with a material different from those of the other part such that the part of the conductor corresponding to the current limiter CL1 has a higher resistance. The current limiter CL1 may be a combination of more than one of the examples described above. For example, the current limiter CL1 may be composed of a single resistive element and a single diode connected in series.

A gate signal G1 output from the controller CNT1 is fed to the gate of the NMOS transistor Q1. One terminal of the capacitor C1 and the drain of the NMOS transistor Q1 are connected to the positive electrode of a direct-current power source PS1. The other terminal of the capacitor C1 is connected to the anode of the diode D1 and to the cathode of the laser diode LD1. The cathode of the diode D1 is connected to one terminal of the current limiter CL1. The other terminal of the current limiter CL1, the anode of the laser diode LD1, the source of the NMOS transistor Q1, and the negative electrode of the direct-current power source PS1 are connected to a ground potential.

A second series circuit DC2 including the diode D1 and the current limiter CL1 is connected in parallel with a first series circuit DC1 including the laser diode LD1 such that the direction pointing from the anode to the cathode of the diode D1 is opposite to the direction pointing from the anode to the cathode of the laser diode LD1.

The controller CNT1 turns on and off the NMOS transistor Q1 with the gate signal G1.

When the NMOS transistor Q1 is off, a current passes from the positive electrode of the direct-current power source PS1 via the capacitor C1, the diode D1, and the current limiter CL1 in this order to the negative electrode of the direct-current power source PS1, and thus the capacitor C1 is charged. When the output voltage of the direct-current power source PS1 becomes approximately equal to the potential difference across the capacitor C1, the current stops passing and the capacitor C1 stops being charged.

When the NMOS transistor Q1 is on, a closed circuit is formed by the NMOS transistor Q1, the capacitor C1, the diode D1, the current limiter CL1, and the laser diode LD1. The closed circuit includes a parasitic inductance. Thus, the closed circuit is an LCR resonant circuit. When the NMOS transistor Q1 turns from off to on with electric charge stored in the capacitor C1, the LCR resonant circuit starts to resonate.

Figure 2:
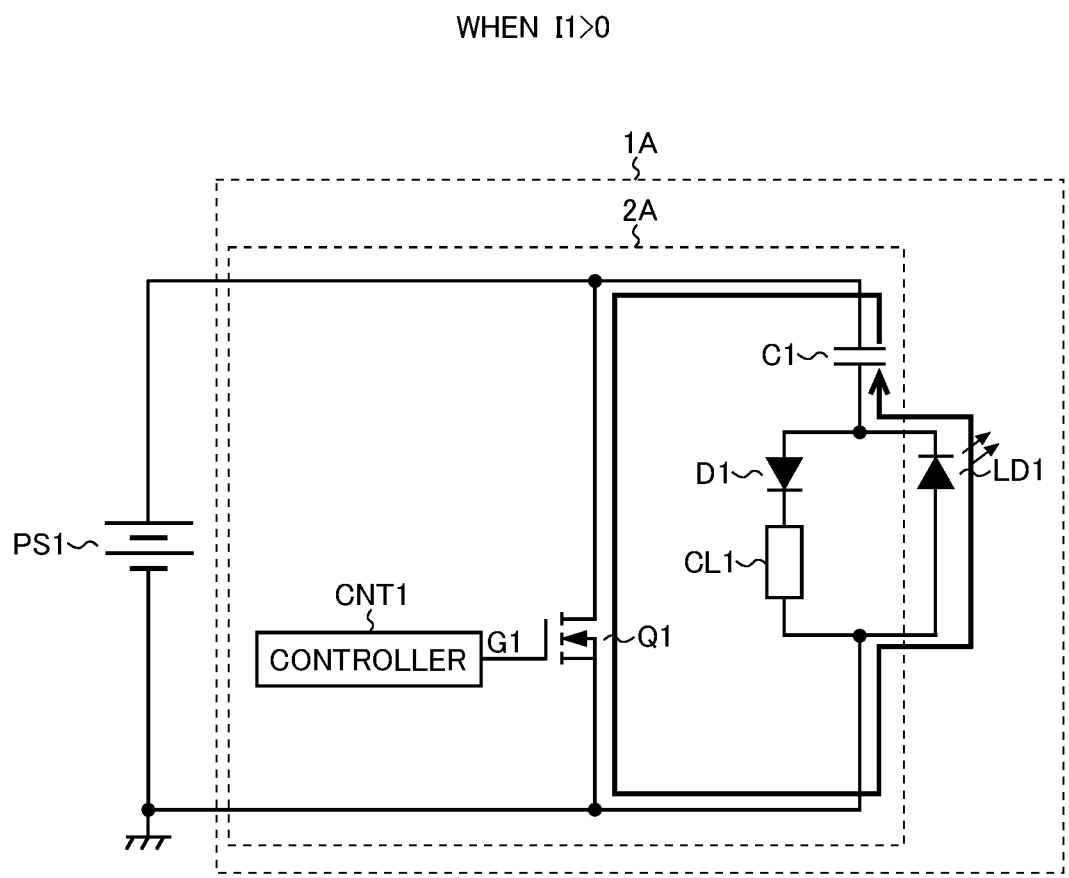
FIG. 2 is a diagram showing a path through which a positive current passes.
Figure 3:
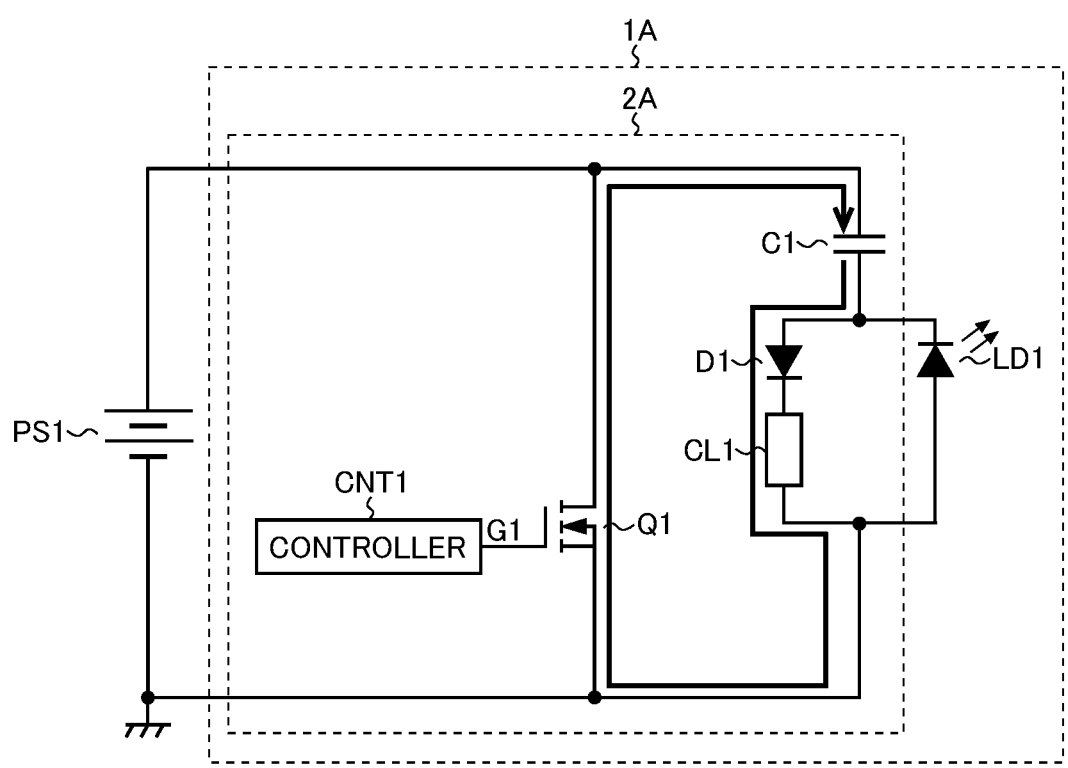
FIG. 3 is a diagram showing a path through which a negative current passes.

When the NMOS transistor Q1 continues to be on, the path through which the current I1 passes when the current I1 passing through the LCR resonant circuit is positive includes the laser diode LD1 as shown in FIG. 2. Thus, when the positive current I1 passes, the laser diode LD1 emits light. The path through which the current I1 passes when the current I1 is negative does not includes the laser diode LD1 as shown in FIG. 3. Thus, when the negative current I1 passes, the laser diode LD1 does not emit light. Here, in this embodiment, the direction pointing from the drain to the source of the NMOS transistor Q1 is defined as the positive direction of the current I1, and the direction pointing from the source to the drain of the NMOS transistor Q1 is defined as the negative direction of the current I1.

Figure 4:
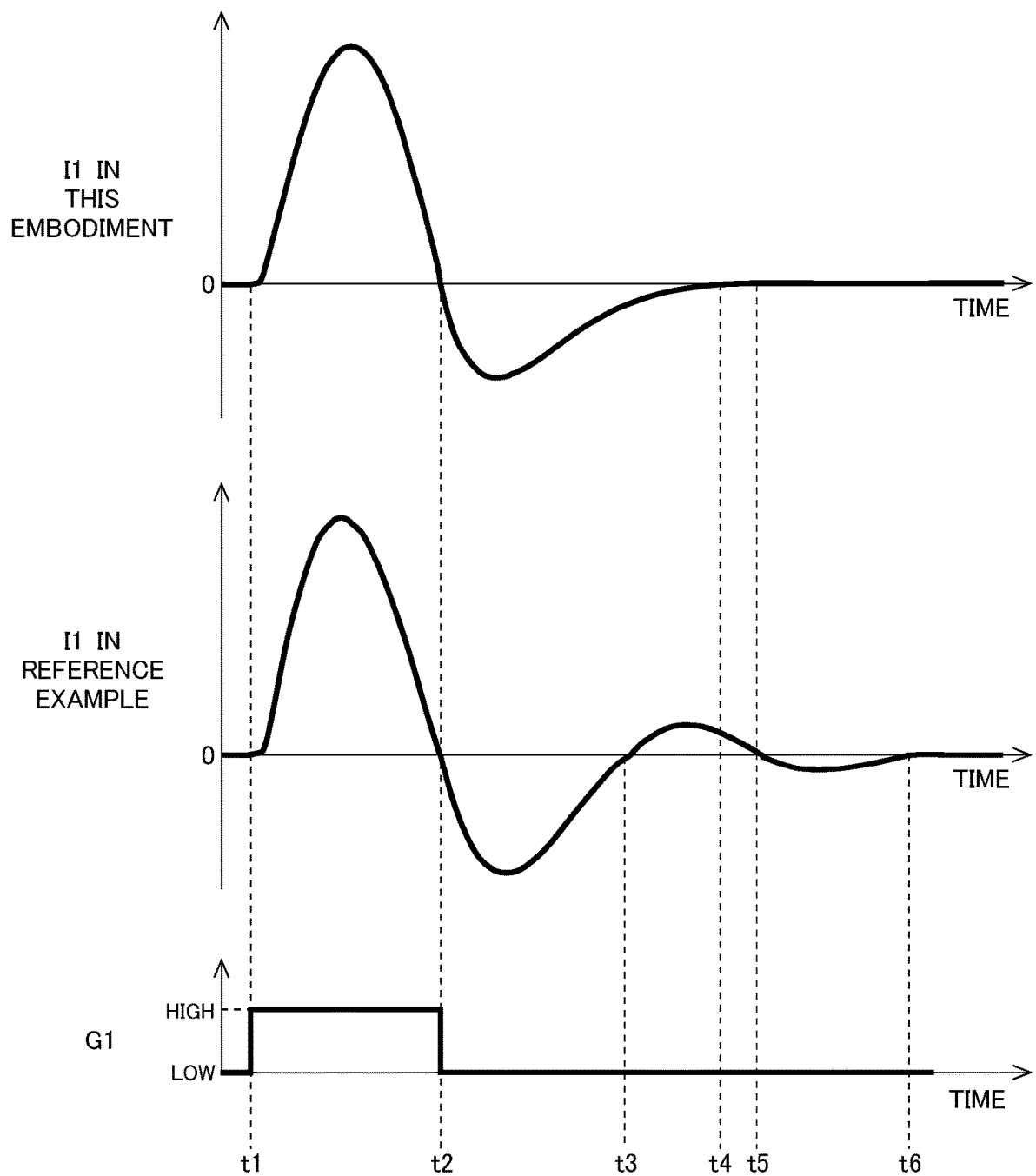
FIG. 4 is a time chart of a current and a gate signal.

FIG. 4 is a time chart showing the waveforms of the current I1 in the embodiment, the current I1 in a reference example, and the gate signal G1. The laser device according to the reference example has a configuration where the current limiter CL1 is omitted from the laser device 1A. In FIG. 4, the high-level period of the gate signal G1, that is, the on-period of the NMOS transistor Q1, is set to a half of the resonance period of the LCR resonant circuit described above.

The on-period of the NMOS transistor Q1 denotes the time period for which the NMOS transistor Q1 is continuously on. Specifically, the period between time points t1 and t2 in FIG. 4 is the on-period of the NMOS transistor Q1 in the embodiment.

In this embodiment, when the NMOS transistor Q1 turns off, thereafter in the period between time points t2 and t4 in FIG. 4, the negative current I1 passes via a body diode of the NMOS transistor Q1. During the period between time points t2 and t4 in FIG. 4, the current I1 is limited by the current limiter CL1. This suppresses the oscillation of the current I1, and thus suppresses the appearance of the positive current I1 after time point t4. Thus, it is possible to suppress unnecessary laser light output.

The current limiter CL1 is not included in the path (see FIG. 2) through which the positive current I1 passes. Thus, the current limiter CL1 brings no disadvantages such as a low rising speed of the laser light output or a drop in the laser light output.

By contrast, in the reference example, when the NMOS transistor Q1 turns off, thereafter during the period between time points t2 and t3 in FIG. 4, the negative current I1 passes via the body diode of the NMOS transistor Q1. In the reference example, no current limiter CL1 is provided, and thus the oscillation of the current I1 is not suppressed. Thus, during the period between time points t3 and t5 in FIG. 4, the positive current I1 passes via a drain-source parasitic capacitance in the NMOS transistor Q1, and, during the period between time points t5 and t6 in FIG. 4, the negative current I1 passes via the body diode of the NMOS transistor Q1. Thus, during the period between time points t3 and t5 in FIG. 4, unnecessary laser light output occurs. Such unnecessary light output may cause, for example, malfunctioning of a laser radar device on a vehicle or the like. Here, if the controller CNT1 turns the NMOS transistor Q1 from on to off at time point t5 or later instead of at time point t2 in FIG. 4, the positive current I1 that passes during the period between time points t3 and t5 in FIG. 4 is limited even less. This further increases the positive current I1 and increases unnecessary laser light output.

As will be clear from what has been discussed above, the laser diode driving circuit 2A and the laser device 1A can suppress unnecessary laser light output.

For example, in a laser radar device, unnecessary laser light output can cause erroneous detection, and thus the laser diode driving circuit 2A and the laser device 1A that can suppress unnecessary laser light output are very useful.

The longer the on-period of the NMOS transistor Q1, the more likely the positive current is to pass after the on-period. However, in this embodiment, owing to the current limiter CL1 being provided, a positive current after the on-period is suppressed; thus it is possible to increase the on-period of the NMOS transistor Q1. That is, with the laser diode driving circuit 2A, it is possible to increase the on-period of the NMOS transistor Q1, and this facilitates generation of the gate signal G1 and control of the NMOS transistor Q1.

2. Second Embodiment

Figure 5:
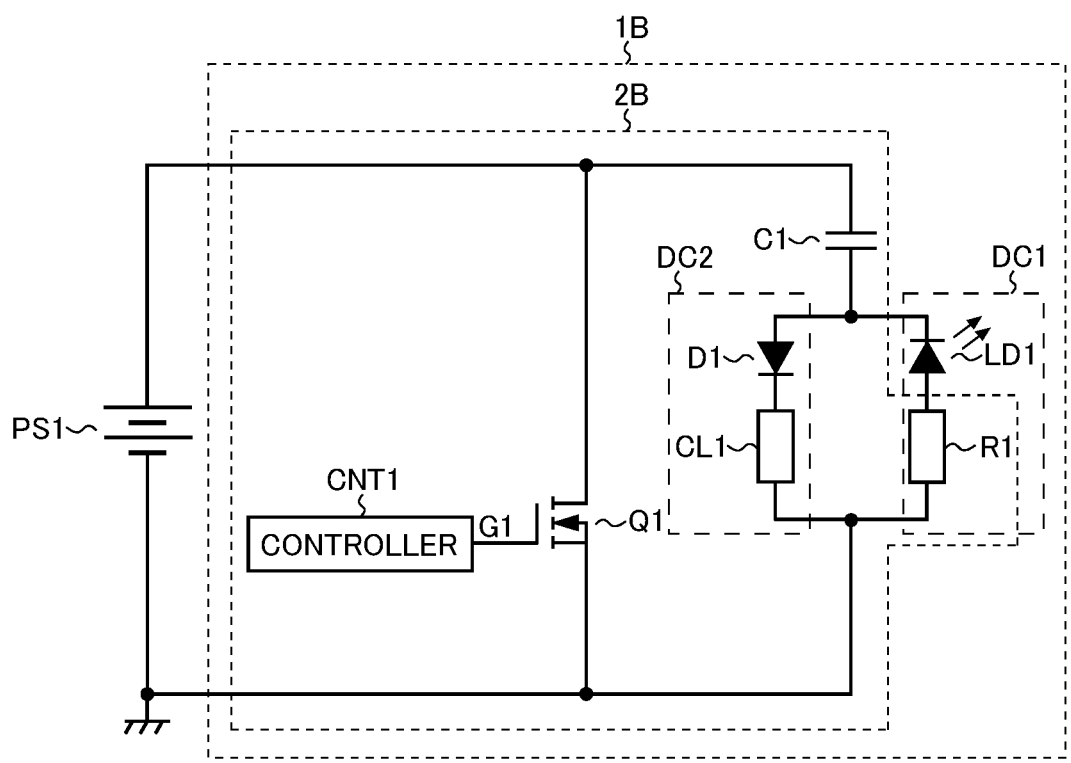
FIG. 5 is a diagram showing an outline of the configuration of a laser device according to a second embodiment.

FIG. 5 is a diagram showing an outline of the configuration of a laser device according to a second embodiment. The laser device 1B according to the second embodiment (hereinafter referred to as the laser device 1B) includes a laser diode LD1 and a laser diode driving circuit 2B.

The laser diode driving circuit 2B has a configuration where a shunt resistor R1 is added to the laser diode driving circuit 2A. In this embodiment, the shunt resistor R1 is included in the first series circuit DC1 and is connected in series with the laser diode LD1.

The laser diode driving circuit 2B and the laser device 1B provide effects similar to those of the laser diode driving circuit 2A and the laser device 1A and can additionally detect the current passing through the laser diode LD1.

The shunt resistor R1 detects the current passing through the laser diode LD1.

A high resistance value in the shunt resistor R1 reduces the maximum value of the current I1 and slows down the rise of the laser light output. Thus, it is important to give the shunt resistor R1 a low resistance value. Accordingly, in this embodiment, the impedance of the shunt resistor R1 is set to be lower than that of the current limiter CL1.

3. Third Embodiment

Figure 6:
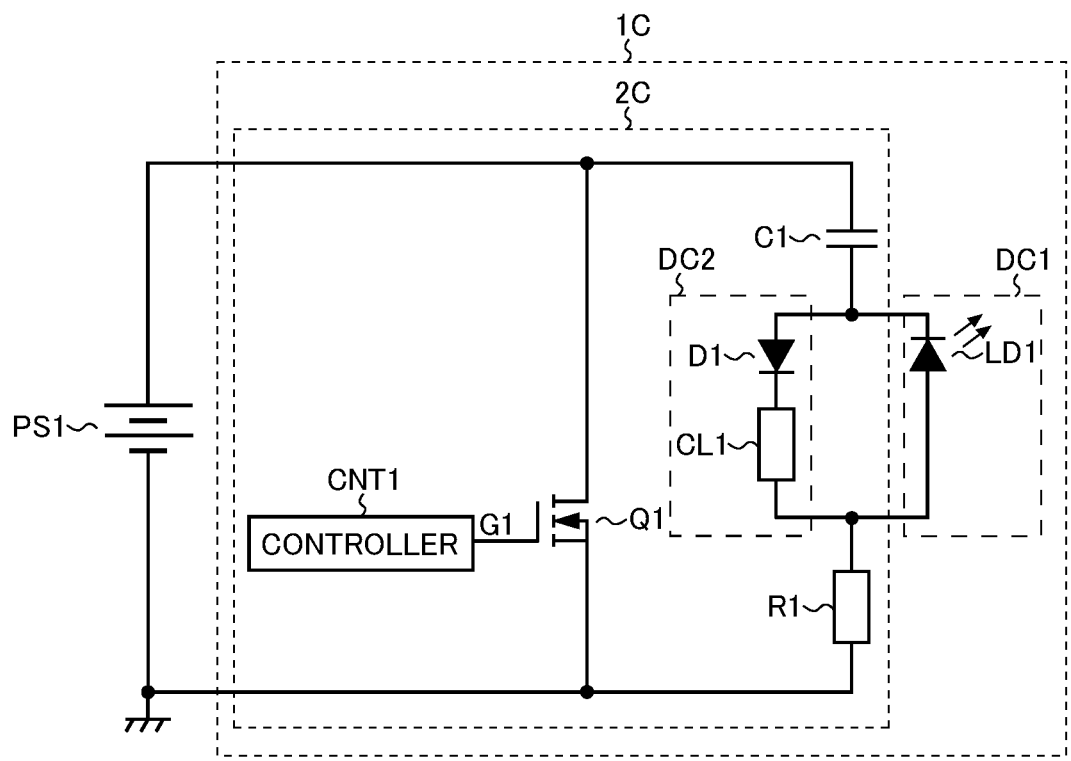
FIG. 6 is a diagram showing an outline of the configuration of a laser device according to a third embodiment.

FIG. 6 is a diagram showing an outline of the configuration of a laser device according to a third embodiment. The laser device 1C according to the third embodiment (hereinafter referred to as the laser device 1C) includes a laser diode LD1 and a laser diode driving circuit 2C.

The laser diode driving circuit 2C has a configuration where a shunt resistor R1 is added to the laser diode driving circuit 2A. In this embodiment, the shunt resistor R1 is connected in series with the parallel circuit formed by the first series circuit DC1 and the second series circuit DC2 connected together.

The laser diode driving circuit 2C and the laser device 1C provide effects similar to those of the laser diode driving circuit 2A and the laser device 1A and can additionally detect the current passing through the laser diode LD1.

The shunt resistor R1 detects the current passing through the laser diode LD1. Here in this embodiment, unlike in the second embodiment, the shunt resistor R1 detects the current passing through the laser diode LD1 with the recovery current of the diode D1 included in it. Thus, accuracy in detecting the current passing through the laser diode LD1 is higher in the second embodiment than in this embodiment.

A high resistance value of the shunt resistor R1 reduces the maximum value of the current I1 and slows down the rise of the laser light output. Thus, it is important to give the shunt resistor R1 a low resistance value. Accordingly, in this embodiment, the impedance of the shunt resistor R1 is set to be lower than that of the current limiter CL1.

<4. Shunt Resistor>

Figure 7:
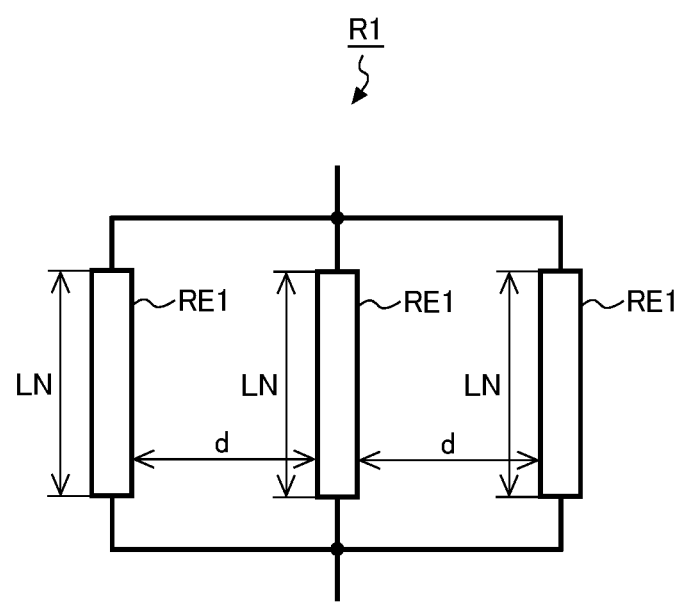
FIG. 7 is a diagram showing one configuration example of a shunt resistor.

FIG. 7 is a diagram showing a configuration example of the shunt resistor R1 used in the second and third embodiments. The shunt resistor R1 in the configuration example shown in FIG. 7 has a plurality of resistive elements RE1 connected in parallel. Connecting the plurality of resistive elements RE1 in parallel makes it easy to reduce the resistance value of the shunt resistor R1.

Although, in the configuration example shown in FIG. 7, three resistive elements RE1 are connected in parallel, the number of resistive elements to be connected in parallel is not limited to three; it can be any number greater than one. The greater the number of resistive elements RE1 connected in parallel, the easier it is to reduce the resistance value of the shunt resistor R1, but the larger the mounting area of the shunt resistor R1. Thus, with consideration given to a tradeoff between the required resistance value in the shunt resistor R1 and the required mounting area for the shunt resistor R1, the number of resistive elements RE1 to be connected in parallel can be determined.

To prevent an unduly long resonance period of the LCR resonant circuit while increasing the maximum value of the current I1, it is preferable that the LCR resonant circuit have a small inductance component. To minimize the parasitic inductance formed in the shunt resistor R1 of the configuration example shown in FIG. 7, it is preferable that the mutual inductance M between adjacent resistive elements RE1 be zero.

The mutual inductance M of adjacent resistive elements RE1 can be given by formula (1) below. Here, LN represents the length of the resistive element RE1 and d represents the interval between adjacent resistive elements RE1. The mutual inductance M is in henries (H), and the length LN and the interval d are both in meters (m).

$$M=2LN(\ln(2LN/d)-1) \times 10^{-7} \quad (1)$$

Thus, the condition for keeping the mutual inductance M zero can be given by formula (2) below. Here, e represents Napier's constant.

$$\ln(2LN/d)-1 \leq 0$$

$$d \geq 2LN/e \quad (2)$$

That is, it is preferable the interval d between adjacent resistive elements RE1 be equal to or larger than the value resulting from dividing double the length LN of the resistive element RE1 by Napier's constant.

<5. Switching Element>

It is preferable that, when the NMOS transistor Q1 provided in each of the laser diode driving circuits 2A to 2C is off, the forward voltage across the body diode of the NMOS transistor Q1 be higher than the forward voltage (for example, 0.7 V) across a common silicon diode. If the forward voltage across the body diode of the NMOS transistor Q1 is high when it is off, the oscillation of the current I1 is suppressed not only by the current limiter CL1 but also by the body diode; thus, it is possible to further suppress unnecessary laser light output. If the oscillation of the current I1 is sufficiently suppressed by the current limiter CL1, it is not necessary that, when the NMOS transistor Q1 is off, the forward voltage across the body diode of the NMOS transistor Q1 be higher than the forward voltage (for example, 0.7 V) across a common silicon diode. If the forward voltage across the body diode of the NMOS transistor Q1 is not higher than the forward voltage (for example, 0.7 V) across a common silicon diode when the NMOS transistor Q1 is off, a "reverse-connected diode" may be connected in parallel with the NMOS transistor Q1. The anode of the "reverse-connected diode" is connected to the source of the NMOS transistor Q1, and the cathode of the "reverse-connected diode" is connected to the drain of the NMOS transistor Q1. The rectification direction of the "reverse-connected diode" is the same as that of the diode D1. As the "reverse-connected diode", for example, a diode with a forward voltage of about 0.3 V can be used. One example of a diode with a forward voltage of about 0.3 V is an SBD (Schottky barrier diode). Thus, as the "reverse-connected diode", for example, an SBD (Schottky barrier diode) can be used.

When the NMOS transistor Q1 is, for example, a switching element using a silicon semiconductor, by setting the gate-source voltage of the NMOS transistor Q1 when it is off at a negative value, that is, by setting the level of the gate signal G1 when the NMOS transistor is off lower than the ground potential, it is possible to set the forward voltages across the body diode of the NMOS transistor Q1 higher than the forward voltage (for example, 0.7 V) across a common silicon diode.

By setting the gate-source voltage of the NMOS transistor Q1 when the NMOS transistor Q1 is off at a negative value, it is possible to prevent the NMOS transistor Q1 from turning on erroneously in the period when the NMOS transistor Q1 is supposed to be off. With the NMOS transistor Q1 prevented from turning on erroneously, it is possible to further suppress unnecessary laser light output.

It is also possible, for example, by using a switching element using a wide-band-gap semiconductor with a band gap greater than the silicon semiconductor as the NMOS transistor Q1, to set the forward voltage across the body diode of the NMOS transistor Q1 higher than the forward voltage (for example, 0.7 V) across a common silicon diode. A wide-band-gap semiconductor with a band gap greater than the silicon semiconductor can be, for example, a compound semiconductor such as SiC, GaN, or the like.

Selecting a transistor with a small output capacity Coss as the NMOS transistor Q1 suppresses the oscillation of the current I1; thus it is possible to further suppress unnecessary laser light output. A transistor with a small output capacity Coss can be, for example, a transistor formed of a wide-band-gap semiconductor with a band gap greater than the silicon semiconductor.

Selecting a transistor with a small input capacity Ciss as the NMOS transistor Q1 improves control performance of the on-period of the NMOS transistor Q1; this makes it easier to suppress unnecessary laser light output. A transistor with a small input capacity Ciss can be, for example, a transistor formed of a wide-band-gap semiconductor with a band gap greater than the silicon semiconductor.

<6. Component Layout>

Figure 8:
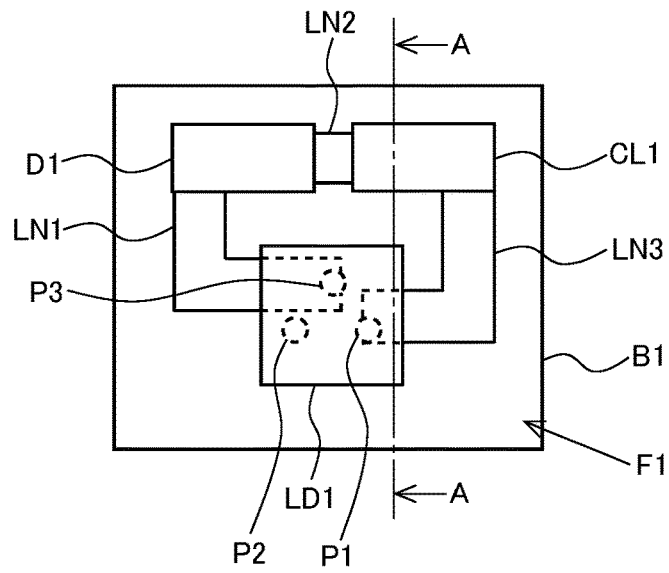
FIG. 8 is a top view of a circuit board.
Figure 9:
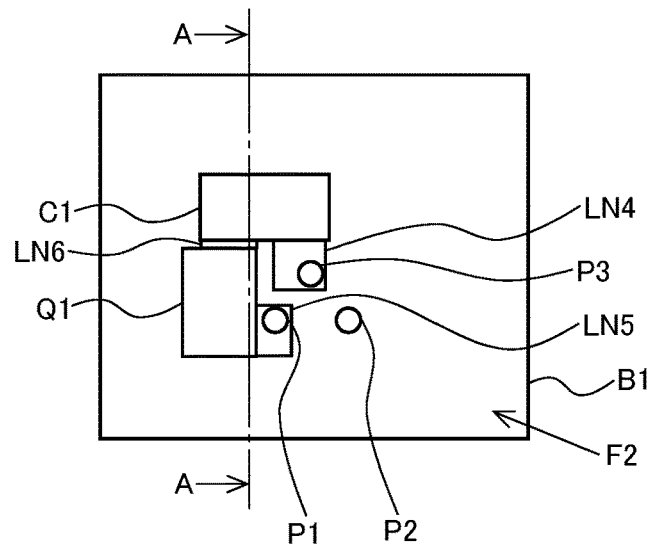
FIG. 9 is a bottom view of the circuit board.
Figure 10:
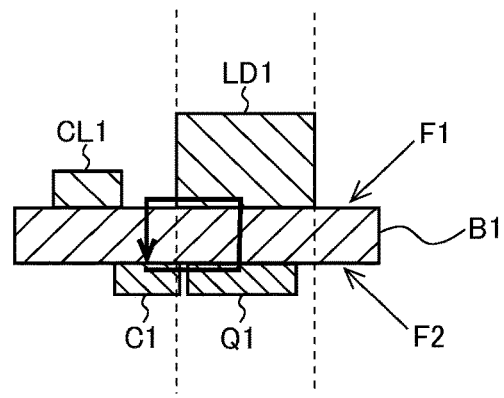
FIG. 10 is a cross-sectional view the circuit board.

FIGS. 8 to 10 are diagrams illustrating one example of component layout according to the first embodiment. FIG. 8 is a top view of a circuit board B1 mounted with the NMOS transistor Q1, the capacitor C1, the diode D1, the current limiter CL1, and the laser diode LD1. FIG. 9 is a bottom view of the circuit board B1 mounted with the NMOS transistor Q1, the capacitor C1, the diode D1, the current limiter CL1, and the laser diode LD1. FIG. 10 is a cross-sectional view of the circuit board B1 cut along sectional plane AA in FIGS. 8 and 9 mounted with the NMOS transistor Q1, the capacitor C1, the diode D1, the current limiter CL1, and the laser diode LD1. The broken lines in FIG. 10 indicate the direction normal to a first face F1 and a second face F2 of the circuit board B1. The first and second faces F1 and F2 of the circuit board B1 face away from and are substantially parallel to each other. Here, the terms "top view" and "bottom view" are used for convenience's sake and are not meant to limit how the laser device should be arranged.

As shown in FIG. 8, on the first face F1 of the circuit board B1, conductors LN1 to LN3 are provided. The conductor LN1 is a conductor that electrically connects Pin-3 (the cathode of the laser diode) P3 of the TO-Can packaged laser diode LD1 to the anode of the diode D1. The conductor LN2 is a conductor that electrically connects the cathode of the diode D1 to one terminal of the current limiter CL1. The conductor LN3 is a conductor that electrically connects the other terminal of the current limiter CL1 to Pin-1 (the anode of the laser diode) P1 of the TO-Can packaged laser diode LD1.

The Pin-2 P2 of the TO-Can packaged laser diode LD1 is the cathode of a light-receiving element incorporated in the To-Can package.

The circuit board B1 has through holes formed in it to be penetrated by Pin-1 to Pin-3 P1 to P3 of the TO-Can packaged laser diode LD1 respectively. Each through hole extends in the direction normal to the first and second faces F1 and F2 of the circuit board B1.

As shown in FIG. 9, on the second face F2 of the circuit board B1, conductors LN4 to LN6 are provided. The conductor LN4 electrically connects Pin-3 (the cathode of the laser diode) P3 of the TO-Can packaged laser diode LD1 to one terminal of the capacitor C1. The conductor LN5 electrically connects Pin-1 (the anode of the laser diode) P1 of the TO-Can packaged laser diode LD1 to the source of the NMOS transistor Q1. The conductor LN6 electrically connects the drain of the NMOS transistor Q1 to the other terminal of the capacitor C1.

In the example of component layout in the first embodiment shown in FIGS. 8 to 10, the laser diode LD1 is mounted on the first face F1 of the circuit board B1, and the NMOS transistor Q1 and the capacitor C1 are mounted on the second face F2 of the circuit board B1. In this way, it is possible to shorten the path (see the thick arrow in FIGS. 2 and 10) across which the positive current I1 passes. This helps reduce the conductor inductance in the path across which the positive current I1 passes. It is thus possible to prevent an unduly long resonance period of the LCR resonant circuit while increasing the maximum value of the current I1.

Here, it is preferable that at least part of at least one of the NMOS transistor Q1 and the capacitor C1 overlap the laser diode LD1 as seen from the direction normal to the first and second faces F1 and F2 of the circuit board B1. In this way, it easier to shorten the path across which the positive current I1 passes.

Although the description above deals with one example of component layout in the first embodiment, employing a similar component layout also in the second and third embodiments helps reduce the conductor inductance in the path across which the positive current I1 passes. Here, the shunt resistor R1 can be arranged on either of the first and second faces F1 and F2.

7. Applications

Figure 11:
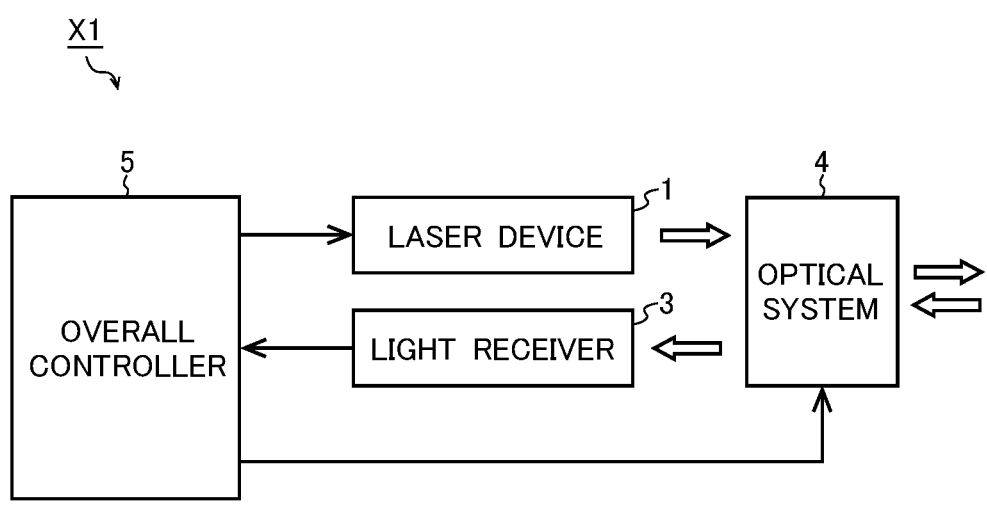
FIG. 11 is a diagram showing an outline of the configuration of a laser radar device.

A laser device 1, which can be any of the laser devices 1A to 1C described above, is used, for example, as part of a laser radar device X1 as shown in FIG. 11. The laser radar device X1 shown in FIG. 11 is a scanning laser radar device and includes the laser device 1, a light receiver 3, an optical system 4, and an overall controller 5. The overall controller 5 controls the output of the laser device 1 and the direction of the mirror in the optical system 4, calculates the distance to an object based on how the output of the laser device 1 is controlled and the output signal from the light receiver 3, and calculates the direction of the object based on how the direction of the mirror in the optical system 4 is controlled.

Figure 12:
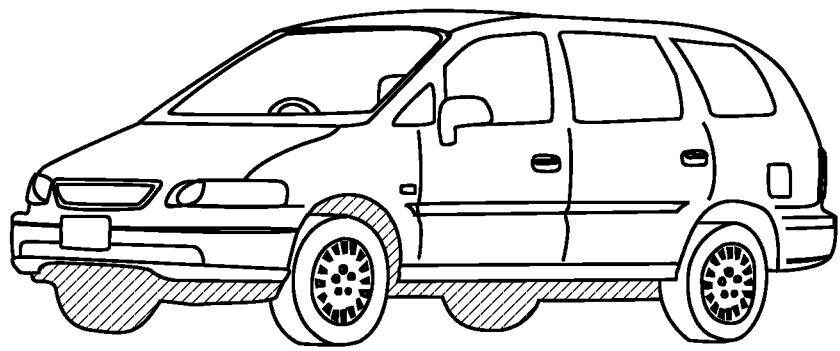
FIG. 12 is an exterior view of a vehicle.

The laser radar device X1 shown in FIG. 11 is arranged, for example, at the front end of a vehicle Y1 as shown in FIG. 12 and senses objects ahead of the vehicle Y1.

8. Other Modifications

The embodiments disclosed herein should be considered to be in every aspect illustrative and not restrictive, and the technical scope of the present invention is defined not by the description of embodiments given above but by the scope of the appended claims and should be understood to encompass any modifications within a sense and scope equivalent to the claims.

Figure 13:
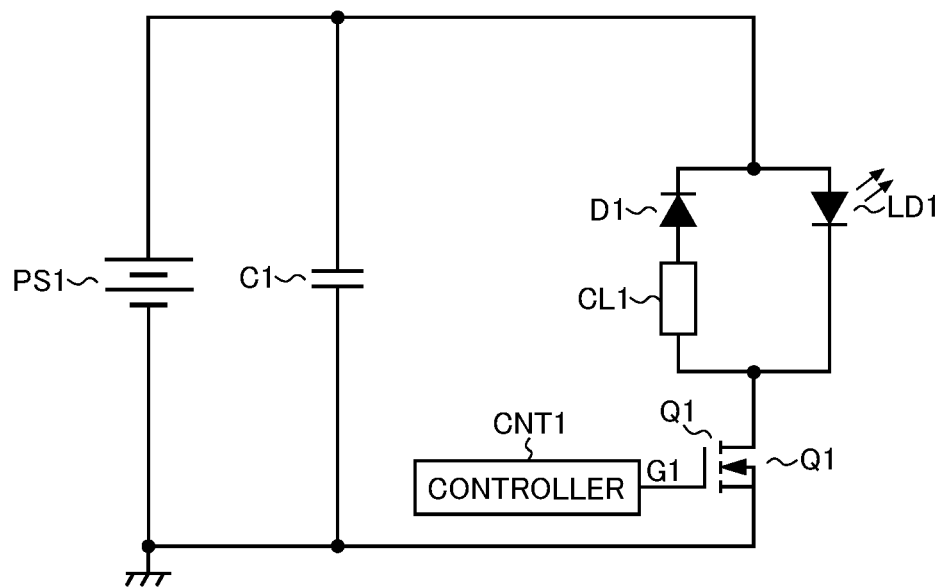
FIG. 13 is a diagram showing a modified example of the laser device according to the first embodiment.
Figure 14:
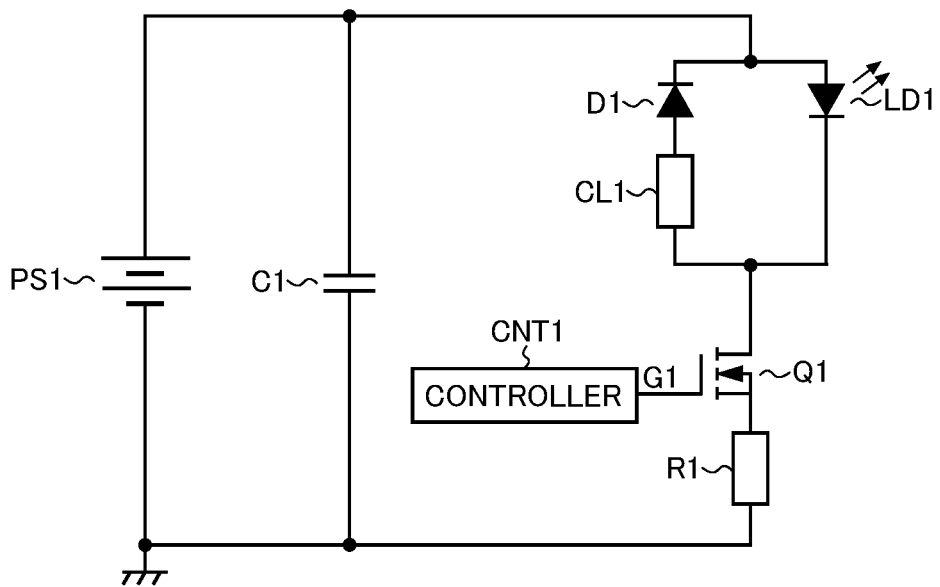
FIG. 14 is a diagram showing a modified example of the laser device according to the third embodiment.

For example, the order in which the capacitor C1, the parallel circuit formed by the first and second series circuits DC1 and DC2, and the NMOS transistor Q1 are connected does not need to be as in the configuration shown in FIGS. 1 to 5. The reason is that, since the capacitor C1, the parallel circuit formed by the first and second series circuits DC1 and DC2, and the NMOS transistor Q1 are connected in series, even if these are connected in a different order, a similar effect can be obtained. If, however, the direction of the body diode of the NMOS transistor Q1 with respect to the diode D1 and the laser diode LD1 becomes opposite from that before the change of connection order, it is necessary to reverse the direction of the diode D1 and the laser diode LD1 too. Accordingly, for example, in the configuration shown in FIG. 13, compared to the configuration shown in FIG. 1, not only the connection order of the capacitor C1, the parallel circuit formed by the first and second series circuits DC1 and DC2, and the NMOS transistor Q1 but also the directions of the diode D1 and the laser diode LD1 are changed. For another example, the order in which the capacitor C1, the parallel circuit formed by the first and second series circuits DC1 and DC2, the shunt resistor R1, and the NMOS transistor Q1 are connected does not need to be as in the configuration shown in FIG. 6. The reason is that, since the capacitor C1, the parallel circuit formed by the first and second series circuits DC1 and DC2, the shunt resistor R1, and the NMOS transistor Q1 are connected in series, even if these are connected in a different order, a similar effect can be obtained. If, however, the direction of the body diode of the NMOS transistor Q1 with respect to the diode D1 and the laser diode LD1 becomes opposite from that before the change of connection order, it is necessary to reverse the direction of the diode D1 and the laser diode LD1 too. Accordingly, for example, in the configuration shown in FIG. 14, compared to the configuration shown in FIG. 6, not only the connection order of the capacitor C1, the parallel circuit formed by the first and second series circuits DC1 and DC2, the shunt resistor R1, and the NMOS transistor Q1 but also the directions of the diode D1 and the laser diode LD1 are changed. Here, in a configuration where the laser diode driving circuit includes the shunt resistor R1, it is preferable that one terminal of the shunt resistor R1 be connected to the ground potential so that the current sensing result is given with reference to the ground potential.

A laser device is not limited to one of a type mounted on a circuit board. For example, at least part of the laser diode driving circuit may be built into a module together with the laser diode and be housed inside a Can package, or at least part of the laser device may be built into a module and be housed inside a container other than a Can package.

For example, the different embodiments and modified examples disclosed herein can be implemented in any feasible combination.

LIST OF REFERENCE SIGNS 1A laser device according to the first embodiment
1B laser device according to the second embodiment
1C laser device according to the third embodiment
2A, 2B, 2C laser diode driving circuit
B1 circuit board
C1 capacitor
CL1 current limiter
CNT1 controller
D1 diode
DC1 first series circuit
DC2 second series circuit
LD1 laser diode
R1 shunt resistor
RE1 resistive element
Q1 NMOS transistor
X1 laser radar device
Y1 vehicle

The invention claimed is:

1. A laser diode driving circuit comprising:
a switching element;
a controller configured to turn on and off the switching element;
a second series circuit connected in parallel with a first series circuit including a laser diode; and
a capacitor, and
a shunt resistor configured to detect a current passing through the laser diode, wherein
the second series circuit includes a rectifying element and a current limiter configured to limit a current passing through the rectifying element, the second series circuit being connected in parallel with the first series circuit such that a direction pointing from an anode to a cathode of the rectifying element is opposite to a direction pointing from an anode to a cathode of the laser diode, and
the capacitor is configured
to be charged when the switching element is off and
to form a closed circuit with the switching element and the first and second series circuits when the switching element is on,
the shunt resistor is included in the first series circuit, and
an impedance of the shunt resistor is configured to be lower than an impedance of the current limiter.

2. A laser diode driving circuit comprising:
a switching element;
a controller configured to turn on and off the switching element;
a second series circuit connected in parallel with a first series circuit including a laser diode; and
a capacitor, and
a shunt resistor configured to detect a current passing through the laser diode,
wherein
the second series circuit includes a rectifying element and a current limiter configured to limit a current passing through the rectifying element, the second series circuit being connected in parallel with the first series circuit such that a direction pointing from an anode to a cathode of the rectifying element is opposite to a direction pointing from an anode to a cathode of the laser diode, and
the capacitor is configured
to be charged when the switching element is off and
to form a closed circuit with the switching element and the first and second series circuits when the switching element is on,
the shunt resistor is provided outside the first series circuit, and
an impedance of the shunt resistor is configured to be lower than an impedance of the current limiter.

3. The laser diode driving circuit according to claim 1, wherein
the shunt resistor has a plurality of resistive elements connected in parallel.

4. The laser diode driving circuit according to claim 3, wherein
an interval between adjacent resistive elements is equal to or larger than a value resulting from dividing double a length of the resistive element by Napier's constant.

5. A laser diode driving circuit comprising:
a switching element;
a controller configured to turn on and off the switching element;
a second series circuit connected in parallel with a first series circuit including a laser diode; and
a capacitor,
wherein
when the switching element is off, a forward voltage across a body diode of the switching element is higher than 0.7 V,
the switching element is a MOS field-effect transistor, and
when the switching element is off, a gate-source voltage of the switching element is negative.

6. The laser diode driving circuit according to claim 1, wherein
the switching element uses a wide-band-gap semiconductor with a band gap greater than a silicon semiconductor.

7. A laser device comprising:
the laser diode driving circuit according to claim 1; and
the laser diode.

8. The laser device according to claim 7, further comprising a circuit board,
wherein
the laser diode is mounted on a first face of the circuit board, and
the switching element and the capacitor are mounted on a second face of the circuit board that faces away from the first face.

9. The laser device according to claim 8, wherein
at least part of at least one of the switching element and the capacitor overlaps the laser diode as seen from a direction normal to the first and second faces.

10. A laser radar device comprising the laser device according to claim 1.

11. A vehicle comprising the laser radar device according to claim 10.

12. A laser device comprising:
the laser diode driving circuit according to claim 2; and
the laser diode.

13. A laser radar device comprising the laser device according to claim 2.

14. A vehicle comprising the laser radar device according to claim 13.

15. A laser device comprising:
the laser diode driving circuit according to claim 5; and
the laser diode.

16. A laser radar device comprising the laser device according to claim 5.

17. A vehicle comprising the laser radar device according to claim 16.

\* \* \* \* \*